(12) United States Patent
Kao et al.

(10) Patent No.: US 12,484,276 B2
(45) Date of Patent: Nov. 25, 2025

(54) REPLACEMENT STRUCTURES (71) Applicant: Taiwan Semiconductor Manufacturing Company, Ltd., Hsinchu (TW)

(72) Inventors: Kuei-Yu Kao, Hsinchu (TW); Shih-Yao Lin, Taipei (TW); Chen-Ping Chen, Yilan (TW); Chih-Chung Chiu, Hsinchu (TW); Chih-Han Lin, Hsinchu (TW); Ming-Ching Chang, Hsinchu (TW); Chao-Cheng Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 684 days.

(21) Appl. No.: 17/811,739

(22) Filed: Jul. 11, 2022

(65) Prior Publication Data
US 2024/0014293 A1 Jan. 11, 2024

(51) Int. Cl.
*H10D 64/01* (2025.01)
*H01L 21/762* (2006.01)
(Continued)

(52) U.S. Cl.
CPC ..... *H10D 64/017* (2025.01); *H01L 21/76224* (2013.01); *H10D 30/014* (2025.01); *H10D 30/43* (2025.01); *H10D 30/6735* (2025.01); *H10D 30/6757* (2025.01); *H10D 62/121* (2025.01); *H10D 64/01* (2025.01); *H10D 64/018* (2025.01); *H10D 64/021* (2025.01); *H10D 84/0128* (2025.01);
(Continued)

(58) Field of Classification Search
CPC ....... H10D 30/024–0245; H10D 30/62; H10D 30/019–0198; H10D 30/501–509; H10D 30/031–0327; H10D 30/67; H10D 30/6735; H10D 62/121; H10D 64/01
See application file for complete search history.

(56) References Cited

U.S. PATENT DOCUMENTS 9,570,580 B1 * 2/2017 Chiang .............. H10D 84/0188
9,911,824 B2 * 3/2018 Ching ............... H01L 21/76897
(Continued)

FOREIGN PATENT DOCUMENTS

TW 202217949 A 5/2022

*Primary Examiner* — Evren Seven
(74) *Attorney, Agent, or Firm* — Ingrassia Fisher & Lorenz, LLP (57) ABSTRACT Provided are devices with replacement structures and methods for fabricating such structures. A method includes forming a layer over a semiconductor material having a top surface in a horizontal plane; forming a dummy structure over the layer, wherein the dummy structure has sidewall, wherein the dummy structure lies directly over a first region of the layer and over a first region of the semiconductor material under the first region of the layer, and wherein the dummy structure does not lie directly over a second region of the layer or over a second region of the semiconductor material under the second region of the layer, and removing the second region of the layer and forming a side edge of the first region of the layer, wherein the side edge forms an angle of from 90 to 100 degrees with the horizontal plane.

20 Claims, 11 Drawing Sheets (51) Int. Cl.
    *H10D 30/01*         (2025.01)
    *H10D 30/43*         (2025.01)
    *H10D 30/67*         (2025.01)
    *H10D 62/10*         (2025.01)
    *H10D 84/01*         (2025.01)
    *H10D 84/03*         (2025.01)
    *H10D 84/83*         (2025.01)

(52) U.S. Cl.
    CPC ...... *H10D 84/0147* (2025.01); *H10D 84/0151* (2025.01); *H10D 84/038* (2025.01); *H10D 84/83* (2025.01)

(56) References Cited

U.S. PATENT DOCUMENTS

| | | |
|---|---|---|
| 11,652,159 B2 | 5/2023 | Lin et al. |
| 2008/0203491 A1* | 8/2008 | Anderson ............ H10D 30/024 257/E29.264 |
| 2011/0260227 A1* | 10/2011 | Kim ..................... H10D 84/834 257/296 |
| 2016/0099352 A1* | 4/2016 | Lee ..................... H10D 84/0158 257/192 |
| 2016/0322473 A1* | 11/2016 | JangJian ............. H10D 84/038 |
| 2018/0151440 A1* | 5/2018 | Liao ................... H10D 30/6211 |
| 2018/0315817 A1* | 11/2018 | Van Dal ............. H10D 84/0193 |
| 2018/0315830 A1* | 11/2018 | Hsieh .................... H10D 30/62 |
| 2019/0148514 A1* | 5/2019 | Lin ..................... H10D 30/024 257/401 |
| 2019/0341300 A1* | 11/2019 | Glass ................ H01L 21/76877 |
| 2020/0044062 A1* | 2/2020 | Fan ..................... H01L 21/3065 |
| 2020/0135880 A1* | 4/2020 | Chen ................. H10D 30/6211 |
| 2020/0135904 A1* | 4/2020 | Chang ................. H10D 64/015 |
| 2021/0143068 A1 | 5/2021 | Xu et al. |
| 2021/0159311 A1* | 5/2021 | Lan ..................... H10D 84/0158 |
| 2022/0216323 A1 | 7/2022 | Lee et al. |

* cited by examiner

REPLACEMENT STRUCTURES

BACKGROUND

The semiconductor integrated circuit (IC) industry has experienced exponential growth over the last few decades. In the course of 1C evolution, functional density (i.e., the number of interconnected devices per chip area) has generally increased while geometry size (i.e., the smallest component (or line) that can be created using a fabrication process) has decreased. One advancement implemented as technology nodes shrink, in some IC designs, has been the replacement of the typically polysilicon gate electrode with a metal gate electrode to improve device performance with the decreased feature sizes.

Decreased feature size has increased the complexity of semiconductor manufacturing processes.

BRIEF DESCRIPTION OF THE DRAWINGS

Aspects of the present disclosure are best understood from the following detailed description when read with the accompanying figures. It should be noted that, in accordance with the standard practice in the industry, various features may not be drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Furthermore, spatially relative terms, such as "over", "overlying", "above", "upper", "top", "under", "underlying", "below", "lower", "bottom", and the like, may be used herein for ease of description to describe one element's or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being "on" another element or layer, it is directly on and in contact with the other element or layer.

In addition, the present disclosure may repeat reference numerals and/or letters in the various examples. This repetition is for the purpose of simplicity and clarity and does not in itself dictate a relationship between the various embodiments and/or configurations discussed.

Certain embodiments herein are generally related to multi-gate transistors. Multi-gate transistors include those transistors whose gate structures are formed on at least two-sides of a channel region. These multi-gate devices may include a p-type metal-oxide-semiconductor device or an n-type metal-oxide-semiconductor multi-gate device. Specific examples may be presented and referred to herein as a gate-all-around (GAA) device. A GAA device includes any device that has its gate structure, or portion thereof, formed on 4-sides of a channel region (e.g., surrounding a portion of a channel region).

Structures presented herein also include embodiments that have channel regions in the form of nanosheets. The term "nanosheet" designates any material portion with nanoscale, or even microscale dimensions, and having an elongate shape, regardless of the cross-sectional shape of this portion. Thus, this term designates both circular and substantially circular cross-section elongate material portions, e.g., nanowires, and beam or bar-shaped material portions including for example a cylindrical or substantially rectangular cross-section.

Presented herein are embodiments that may have one or more channel regions associated with a single, contiguous gate structure. However, one of ordinary skill would recognize that the teaching can apply to a single channel region or any number of channel regions. One of ordinary skill may recognize other examples of semiconductor devices that may benefit from aspects of the present disclosure.

Certain embodiments disclosed herein relate to the replacement of sacrificial or dummy gates with replacement gates. For example, high k metal gates may be fabricated in cavities formed by removing polysilicon dummy gates.

Certain embodiments disclosed herein relate generally to reducing or prevent shorting at replacement gate structures.

Further, certain embodiments herein provide for a larger process window by ensuring that sufficient insulation surrounds a dummy gate, the cavity formed by removing the dummy gate, and the replacement gate thereafter.

Figure 1:
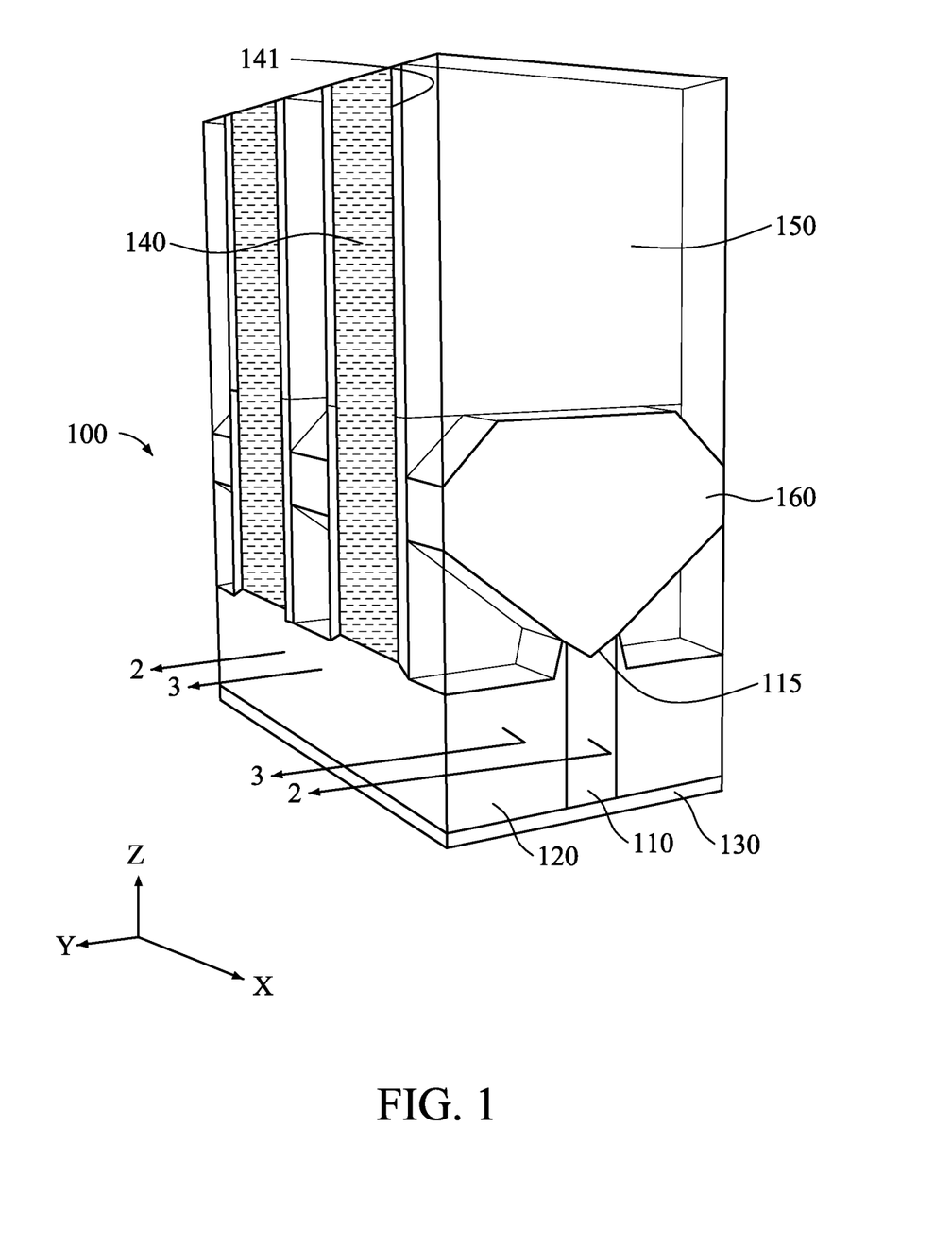
FIG. 1 is a perspective schematic of a device in accordance with some embodiments of the present disclosure.

Referring now to the Figures, FIG. 1 is a perspective schematic of a semiconductor device 100 in accordance with embodiments herein.

As shown, the device 100 includes a semiconductor structure 110 and an isolation 120 adjacent to the semiconductor structure 110. An exemplary semiconductor structure 110 comprises silicon, silicon germanium, a removable, sacrificial or dummy material, such as a dummy gate, or other suitable semiconductor material. An exemplary isolation 120 is a shallow trench isolation (STI) and may comprise SiO, SiN, SiON, SiCN, SiOCN, or other dielectric material. In exemplary embodiments, the semiconductor structure 110 and isolation 120 are located over a substrate 130. An exemplary semiconductor structure 110 is a fin. In certain embodiments, the semiconductor structure 110 is formed by etching an upper portion of the substrate 130. The fin extends in the direction of the X-axis. As shown, overlying structures 140 are located over the semiconductor structure 110 and the isolation 120. Exemplary overlying structures 140 are gate structures, such as conductive gates. Exemplary conductive gates may be formed from high k material, such as HfO, TaN, or other suitable materials. Exemplary conductive gates may be formed from metal, such as tungsten (W), copper (Cu) or cobalt (Co). The overlying structures 140 extend parallel to one another in the direction of the Y-axis and are spaced apart from one another in the direction of the X-axis.

Further, the overlying structures 140 extend upward, in the direction of the Z-axis, and have sidewalls 141. Exemplary overlying structures 140 have substantially vertical sidewalls 141, i.e., the surface of each sidewall is in a plane defined by the Z-axis and the Y-axis and is perpendicular to the plane of the underlying substrate 130, defined by the Y-axis and the X-axis. As shown, a spacer 150 is located on each sidewall 141 of the overlying structures 140. Spacer 150 may include more than one layer or sublayer. An exemplary spacer 150 may comprise SiCN, SiOCN, SiON, SiN, or other suitable materials.

As further shown, source/drain regions 160 are located on recessed surfaces 115 of the semiconductor structure 110 on opposite sides of the overlying structures 140.

Figure 2:
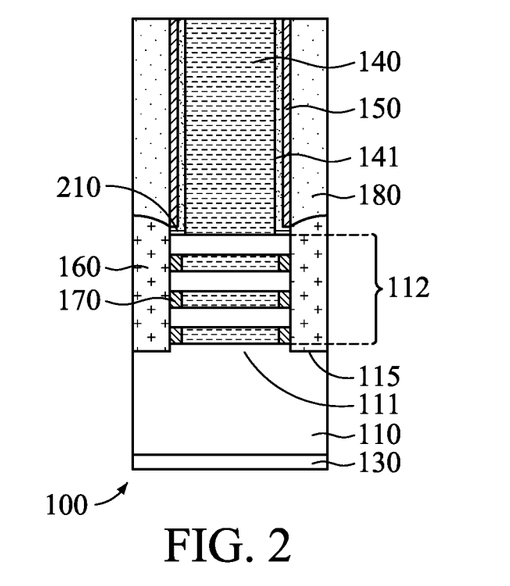
FIG. 2 is a cross sectional view through a semiconductor structure of the device of FIG. 1 in accordance with some embodiments of the present disclosure.
Figure 3:
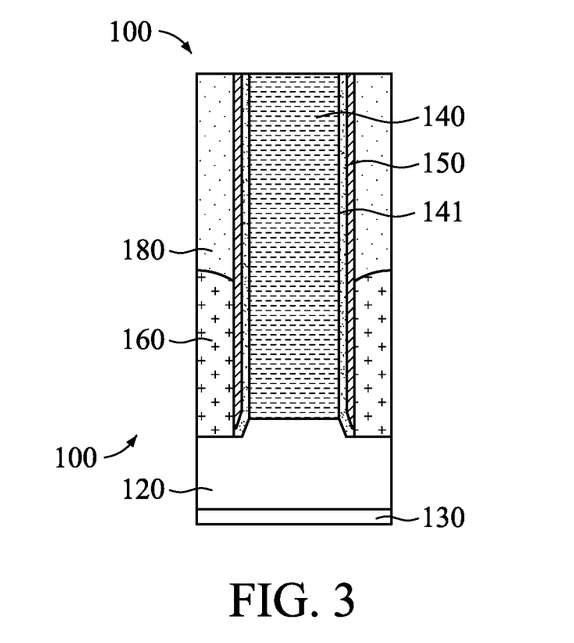
FIG. 3 is a cross sectional view through an isolation of the device of FIG. 1 in accordance with some embodiments of the present disclosure.

FIGS. 2 and 3 provide cross-sectional views of portions of the device 100 of FIG. 1. FIG. 2 is a cross sectional view taken along line 2-2 in FIG. 1, i.e., is a view taken along a plane defined by the X-axis and Z-axis passing through semiconductor structure 110. FIG. 3 is a cross sectional view taken along line 3-3 in FIG. 1, i.e., is a view taken along a plane defined by the X-axis and Z-axis passing through isolation 120.

As shown in FIG. 2, the exemplary semiconductor structure 110 includes a fin portion 111 and a nanostructure portion 112. The nanostructure portion 112 includes alternating layers of a semiconductor material separated by gate material. In exemplary embodiments, the semiconductor material is SiGe. In exemplary embodiments, the fin portion and the nanostructure portion 112 may be formed from the same semiconductor material. The semiconductor layers of the nanostructure 112 may form a channel region, such as in a gate-all-around FET (GAAFET). The semiconductor layers of the nanostructure 112 may be referred to as nanosheets or nanowires.

As further shown in FIG. 2, inner spacers 170 isolate the gate material in the nanostructure portion 112 from the source/drain regions 160. Exemplary inner spacers comprise SiCN, SiOCN, SiON, SiN, or other suitable materials.

Also, a contact etch stop layer and interlayer dielectric material 180 lie over the source/drain regions 160 and surround the overlying structures 140. It is noted that the contact etch stop layer and interlayer dielectric material 180 illustrated as being transparent in FIG. 1 to facilitate viewing internal components of device 100.

FIG. 2 illustrates that a dielectric stop layer 210 is located directly under the spacer 150. The dielectric stop layer 210 is located directly on the uppermost surface of the nanostructure 112 of the semiconductor structure 110.

As noted above, FIG. 3 provides a cross sectional view of the device 100 along a plane passing through the isolation 120, i.e., distanced from the viewing plane of FIG. 2 by a distance in the direction of the Y-axis. As shown, the overlying structure 140 is located on the isolation 120. Further, the spacer 150 surrounds the sidewalls 141 of the overlying structure 140. As shown, the spacer 150 also contacts the isolation 120. As further shown, contact etch stop layer and interlayer dielectric material 180 lie over the source/drain regions 160 and surround the overlying structures 140.

Figure 4:
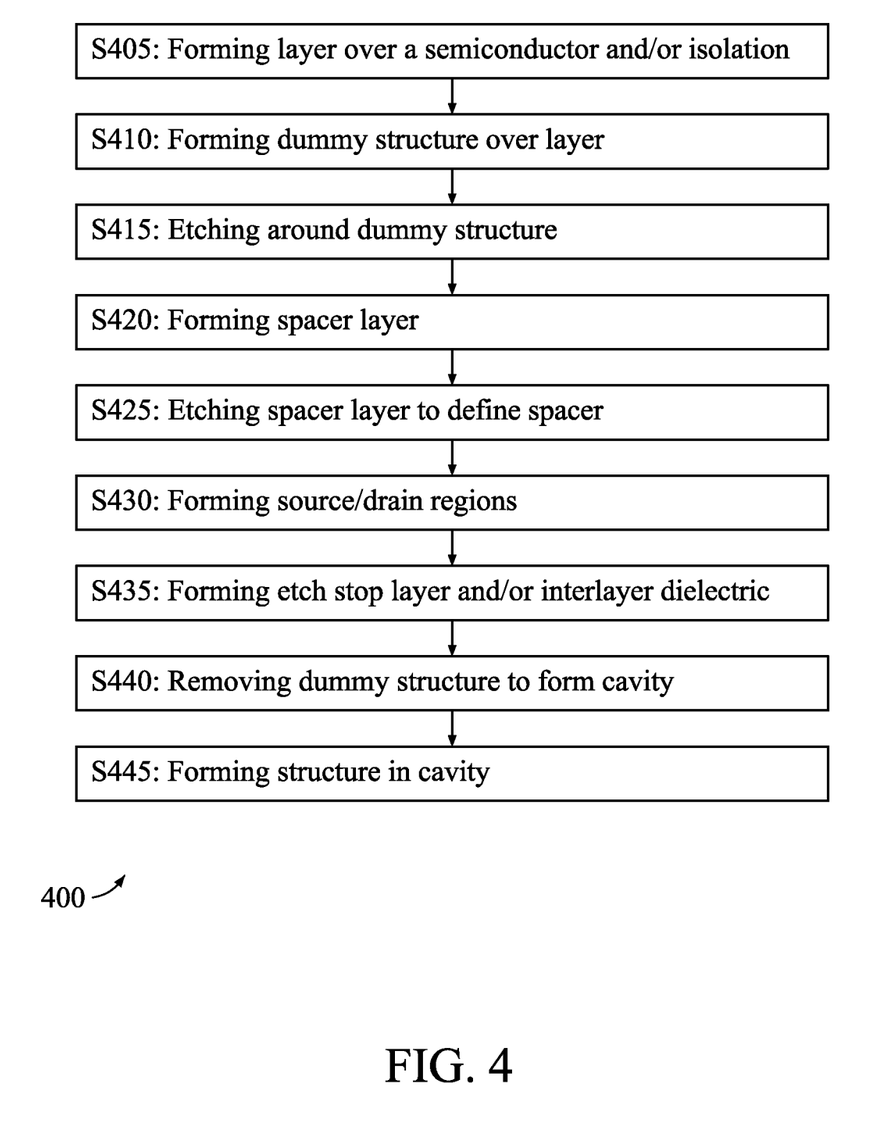
FIG. 4 is a flow chart illustrating a method for fabricating the device of FIGS. 1-3, in accordance with embodiments.
Figure 5:
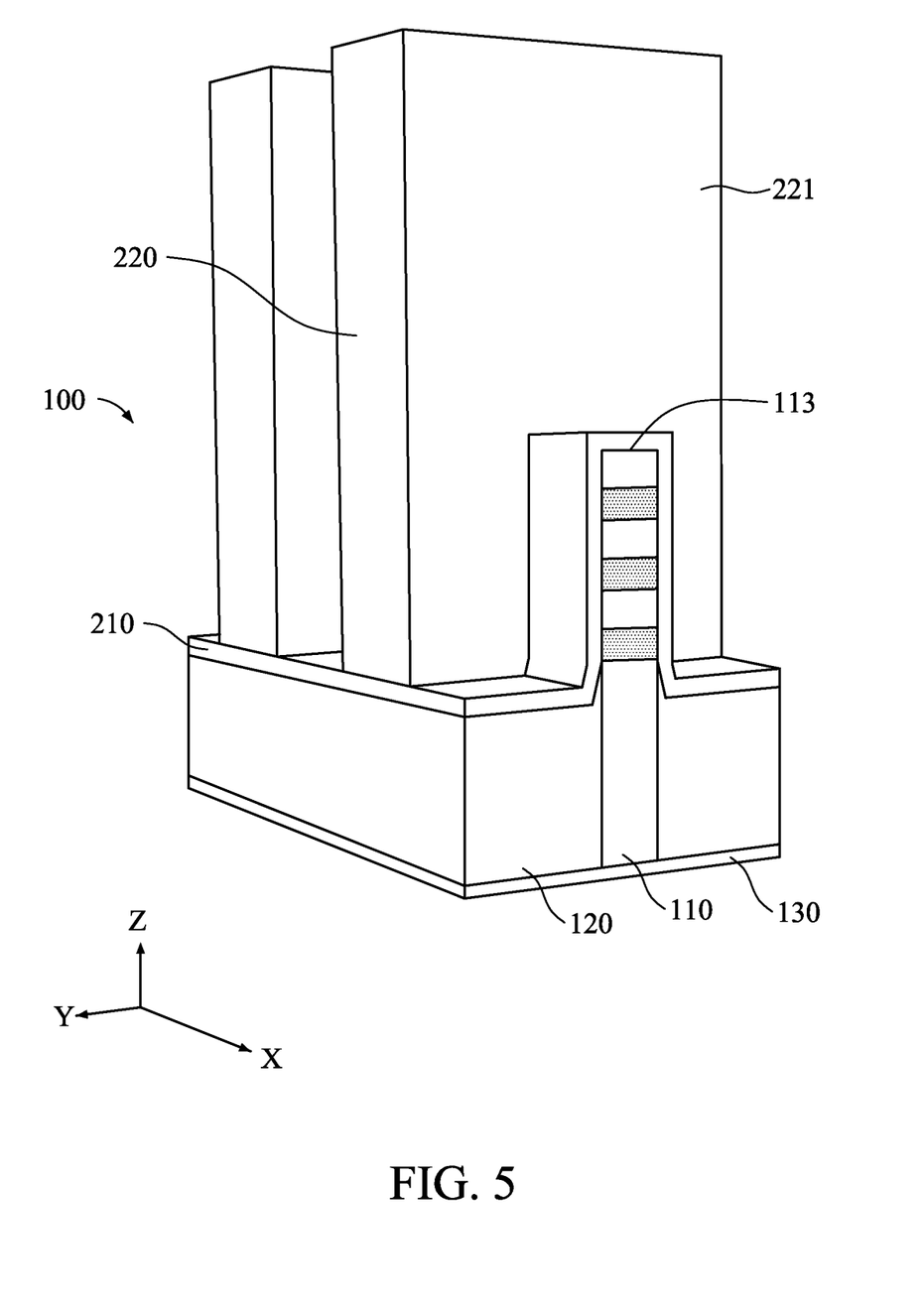
FIGS. 5-7 illustrate a stage of fabrication of the device of FIG. 1 in accordance with some embodiments of the present disclosure, with FIG. 5 being a perspective schematic of the device, FIG. 6 being a cross sectional view through the semiconductor structure of the device, and FIG. 7 being a cross sectional view through an isolation of the device.
Figure 6:
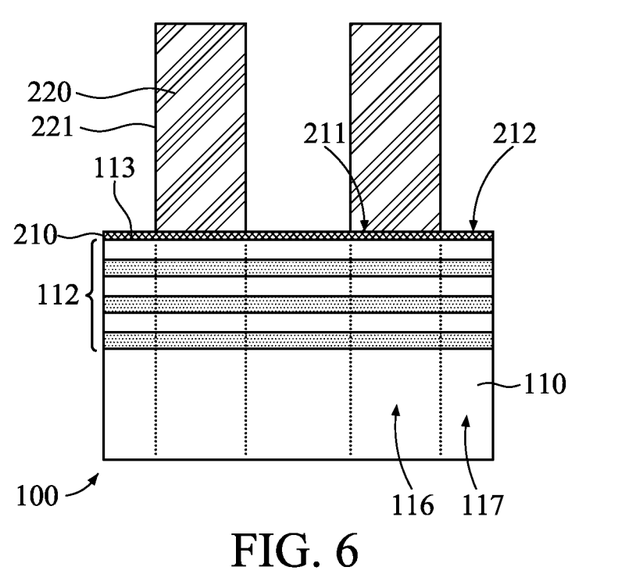
Figure 7:
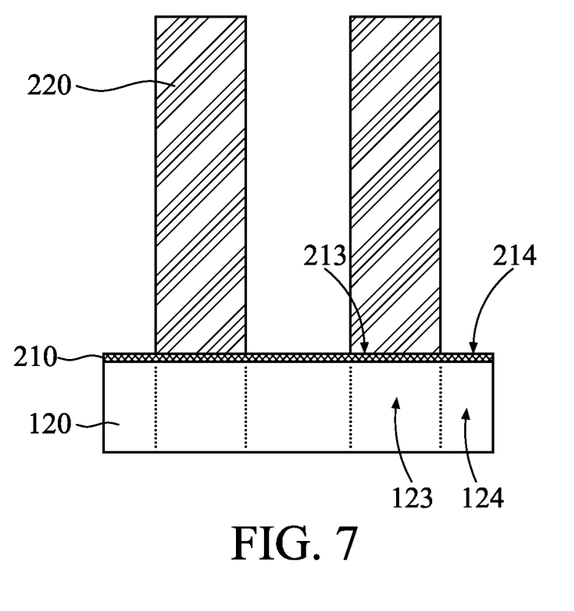
Figure 8:
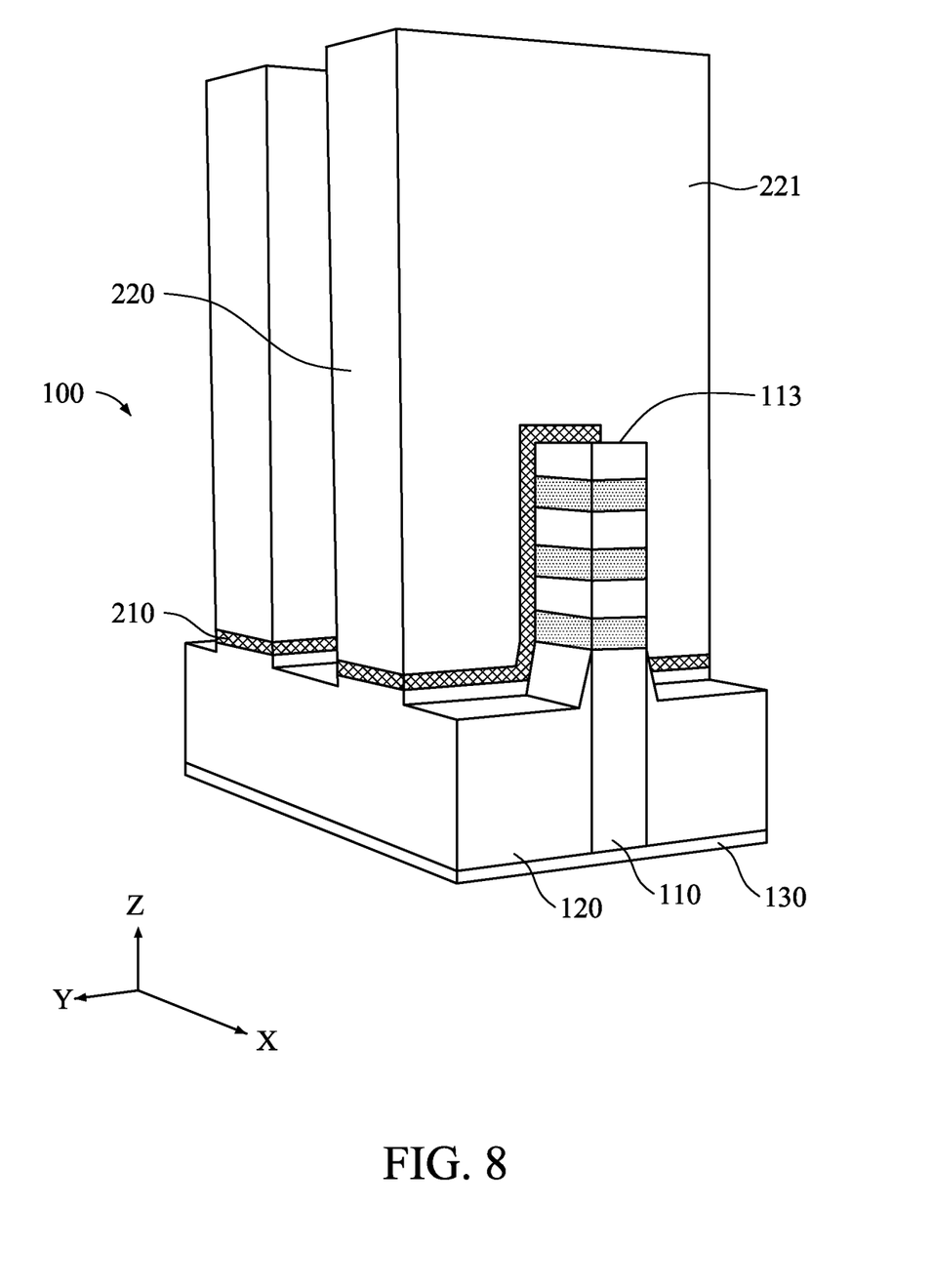
FIGS. 8-10 illustrate a stage of fabrication of the device of FIG. 1 in accordance with some embodiments of the present disclosure, with FIG. 8 being a perspective schematic of the device, FIG. 9 being a cross sectional view through the semiconductor structure of the device, and FIG. 10 being a cross sectional view through an isolation of the device.

FIG. 4 provides a flow chart illustrating a method 400 for fabricating the device 100 of FIGS. 1-3. Operations of method 400 are described in conjunction with FIGS. 5-7, FIGS. 8-10, FIGS. 11-12, FIGS. 13-14, and FIGS. 15-17, which illustrates successive stages of the semiconductor structure during fabrication. FIGS. 5, 8, and 15 are perspective schematics with a similar view as FIG. 1. FIGS. 6, 9, 11, and 13 are cross sectional views taken along a plane defined by the X-axis and Z-axis passing through semiconductor structure 110, similar to FIG. 2. FIGS. 7, 10, 12, and 14 are cross sectional views taken along a plane defined by the X-axis and Z-axis passing through isolation 120, similar to FIG. 3.

At operation S405, method 400 includes forming a layer over a semiconductor material and/or isolation. The layer may be considered to be a dummy layer As shown in FIGS. 5-7, layer 210 is conformally deposited over isolation 120 and over semiconductor structure 110. An exemplary layer 210 is a dielectric etch stop layer. For example, layer 210 may be silicon oxide or another suitable material. In exemplary embodiments, layer 210 is formed with a thickness of from 2 to 5 nanometers (nm).

In exemplary embodiments, layer 210 is formed directly on an uppermost or top surface 113 of the semiconductor structure 110. Further, layer 210 is formed along the sides of the semiconductor structure 110 that extend above isolation 120. As shown, top surface 113 may be formed by the uppermost semiconductor layer in the nanostructure portion 112 of the semiconductor structure 110. It should be noted that at this stage of fabrication, the nanostructure portion 112 of the semiconductor structure 110 includes alternating layers of different semiconductor materials.

FIG. 4 further illustrates that method 400 includes operation S410, wherein method 400 forms a dummy structure over the layer.

Referring back to FIGS. 5-7, dummy structures 220 are formed over layer 210. In exemplary embodiments, the dummy structures 220 are dummy gates. As shown, the dummy structures 220 are parallel and extend in the direction of the Y-axis. Further, the dummy structures 220 are spaced from one another in the direction of the X-axis.

Exemplary dummy structures 220 have sidewalls 221 that may be vertical. For example, the sidewalls 221 may lie in planes defined by the Y-axis and Z-axis.

As shown in FIG. 6, each dummy structure 220 lies directly over a region 211 of the layer 210 and over a region 116 of the semiconductor structure 110 under the region 211 of the insulation layer 210. As further shown, the dummy structure 220 does not lie directly over regions 212 of the insulation layer 210 or over regions 117 of the semiconductor structure 110 under the regions 212 of the insulation layer 210.

Likewise, as shown in FIG. 7, each dummy structure 220 lies directly over a region 213 of the layer 210 and over a region 123 of the isolation 120 under the region 213 of the insulation layer 210. As further shown, the dummy structure 220 does not lie directly over regions 214 of the insulation layer 210 or over regions 124 of the isolation 120 under the regions 214 of the insulation layer 210.

Method 400 may continue in FIG. 3 with etching around the dummy structures at operation S415.

In an exemplary embodiment, the etching operation removes the uncovered regions of layer 210, i.e., the regions of layer 210 not directly under the dummy structures 220. Further, the etching operation forms a side edge of the covered regions of the layer 210. In exemplary embodiments, the side edge forms an angle of from 90 to 100 degrees with the horizontal plane, i.e., the plane formed by the X-axis and Y-axis. Conventional processing typically forms a side edge at a more obtuse angle, such as around 110 degrees. Thus, the processing described herein removes more of the uncovered regions of layer 210 and exposes more of the underlying uppermost or top surface 113 of the semiconductor structure 110. As a result, a later-formed spacer layer contacts an increased amount of the top surface 113 of the semiconductor structure 110, such as to a side edge of the covered regions of layer 210 that is aligned with dummy structures 220. The increased amount of spacer layer (and reduced distance between the spacer layer and the dummy structures) provides a larger process window during later etching processes.

Figure 10:
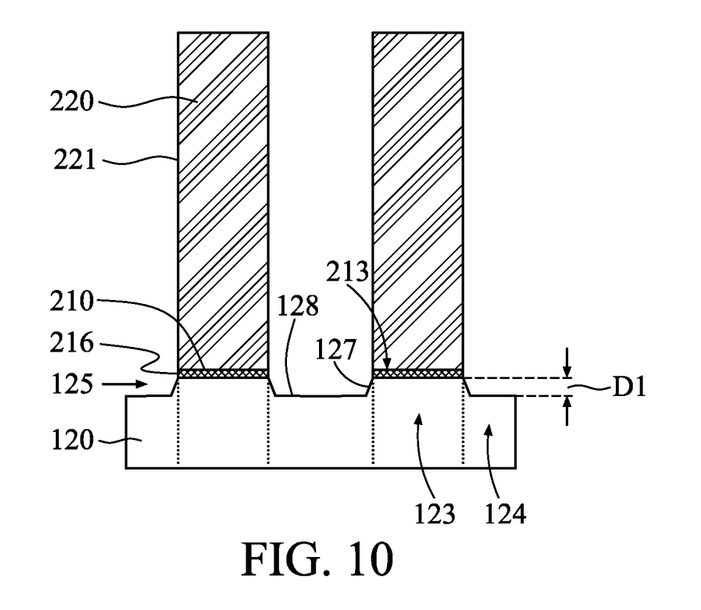

An exemplary etching operation lands on the top surface 113 of the semiconductor structure 110. Further, an exemplary etching operation removes an upper level of the second region of the isolation to form an isolation cavity in the isolation. Specifically, the etch operation etches into the regions 124 of the isolation 120 lying under the uncovered regions 214 of layer 210, as shown in FIG. 10. In an exemplary embodiment, the regions 124 of the isolation 120 are etched to a depth D1 of from 3 to 20 nanometers (nm). As a result, the later-formed spacer layer extends to depth D1 below the upper surface of region 213 on which overlying structures 140 are later formed. Thus, the bottom corners of the overlying structures 140 are insulated both in a horizontal direction and vertical direction, improving the process window.

In exemplary embodiments, the etching operation is a plasma etch. For example, the etch may be performed with an etch gas of $HF/NH_3$, or another suitable etch gas, with a passivation gas for selectivity selected from $N_2$, $O_2$, $CO_2$, or another suitable passivation gas, with a dilute gas selected from He, Ar, $N_2$, or another suitable dilute gas, with a power of from about 10 W to about 4000 W, at a pressure of from about 1 mTorr to about 800 mTorr, and with a gas flow of from about 20 sccm to about 3000 sccm.

Figure 9:
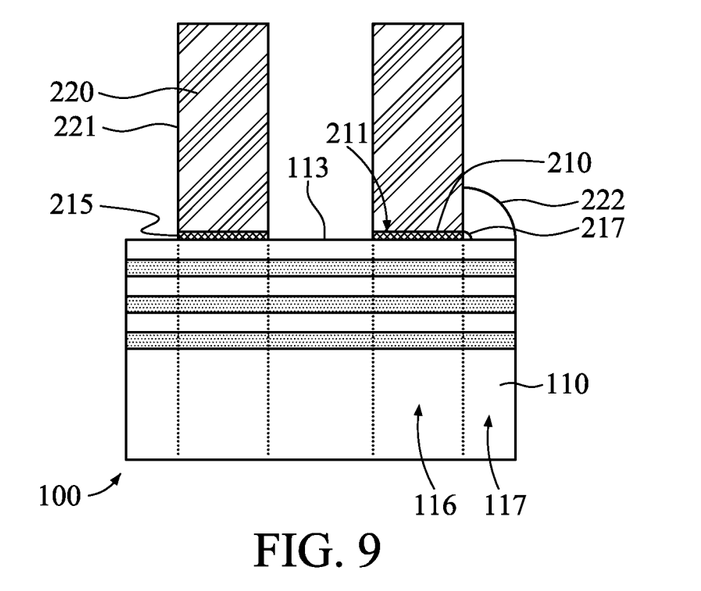

Referring to FIGS. 8-10, the result of the etch at operation S415 may be seen at the illustrated stage of fabrication of device 100. As shown in FIG. 9, the regions 212 (shown in FIG. 6) of the layer 210 are removed from over the top surface 113 of the semiconductor structure 110. As a result, each remaining region 211 of the layer 210 is formed with a side edge 215. In exemplary embodiments, the entirety of each side edge 215 is parallel with the dummy structure sidewall 221 or lies under the dummy structure 220. In exemplary embodiments, each side edge 215 forms an angle 217 of from 90 to 100 degrees with a horizontal plane defined by the X-axis and the Y-axis. For a frame of reference, angle 222 is formed between the side wall 221 of the dummy structure 220 and the horizontal plane of the top surface 113. In FIG. 9, angle 222 is 90 degrees. Thus, the angle 217 formed by each side edge 215 and top surface 113 is the same, 90 degrees, or is slight larger, up to 100 degrees, such that a lower end of the side edge 215 adjacent top surface 113 is not directly under the dummy structure 220.

As shown in FIG. 10, the regions 214 (shown in FIG. 7) of the layer 210 are removed. Remaining regions 213 may be formed with side edges 216. In exemplary embodiments, side edges 216 are parallel with the sidewalls 221 of the dummy structures 220.

Further, an upper level of regions 124 of isolation 120 is removed by the etch operation to form isolation cavities 125 in regions 124. Specifically, a maximum depth D1 of each region 124 is removed. In exemplary embodiments, depth D1 may be from 3 to 20 nanomaters (nm) As shown, isolation sidewalls 127 bound the sides of and extend from a cavity bottom surface 128 of each isolation cavity 125 to the unetched regions 123 of the isolation 120.

FIG. 4 further illustrates that method 400 continues at operation S420 with forming a spacer layer. An exemplary spacer layer may include more than one layer or sublayer. An exemplary spacer layer may comprise SiCN, SiOCN, SiON, SiN, or other suitable materials.

In exemplary embodiments, the spacer layer is conformally deposited over the device 100 of FIGS. 8-10. Thus, the spacer layer lies over the top surfaces and sidewalls of the dummy structure 220, over the uncovered top surface and sidewalls of the semiconductor structure 110, over the exposed regions 124 of the isolation 120, and on the side edges 215 and 216 of the layer 210. An exemplary spacer layer has a thickness of from 3 to 10 nanometers (nm).

Method 400 further includes etching the spacer layer to define spacers at operation S425. For example, the dummy structures, and the spacer layer on the sidewalls of the dummy structure, may be masked while exposed portions of the spacer layer are removed. Thus, spacers are formed on the top of and on the sidewalls of the dummy structure, on the side edges 215 and 216 of the layer 210, and on the isolation sidewalls 127. The spacers are formed with a maximum thickness of from 3 to 10 nanometers (nm).

An upward-extending portion of the gate spacer layer extends from the semiconductor structure to a top of the dummy structure, and an inner sub-region of region 117 of the semiconductor material lies directly under the upward-extending portion of the gate spacer layer. Further, an outer sub-region of the second region of the semiconductor material does not lie directly under the upward-extending portion of the gate spacer layer. When etching, the spacer layer is removed from the outer sub-region of the region 117 of the semiconductor structure 110, and a remaining portion of the gate spacer layer forms the spacer on the dummy structure sidewall and on the side edge 215 of the layer 210.

In exemplary embodiments, the process for etching at operation S425 includes etching the regions 117 of the semiconductor structure 110 to a recessed surface. Further, the process of etching at operation S425 may include recessing alternating layers in the nanostructure portion. The etched portions of alternating layer may be replaced with an inner spacer.

Operation S430 of method 400 includes forming source/drain regions. Specifically, source/drain regions are formed over the remaining semiconductor structure 110 in regions 117. In exemplary embodiments, epitaxial source/drain regions are grown on the recessed surface of the regions 117.

Operation S435 of method 400 includes forming an etch stop layer and/or interlayer dielectric material over the source/drain regions and around the dummy structures. For example, an etch stop layer and interlayer dielectric material may be sequentially deposited. Then a planarization process may be performed to remover material over the top of the dummy structures.

Figure 11:
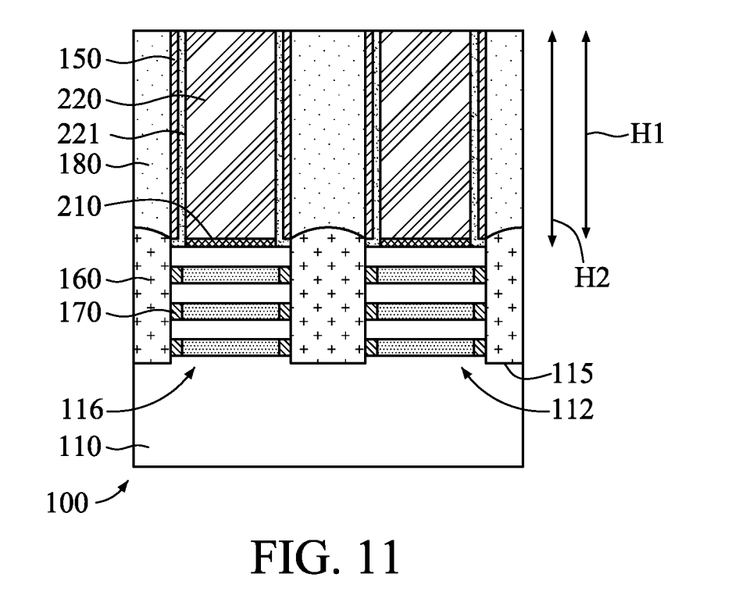
FIGS. 11-12 illustrate a stage of fabrication of the device of FIG. 1 in accordance with some embodiments of the present disclosure, with FIG. 11 being a cross sectional view through the semiconductor structure of the device, and FIG. 12 being a cross sectional view through an isolation of the device.
Figure 12:
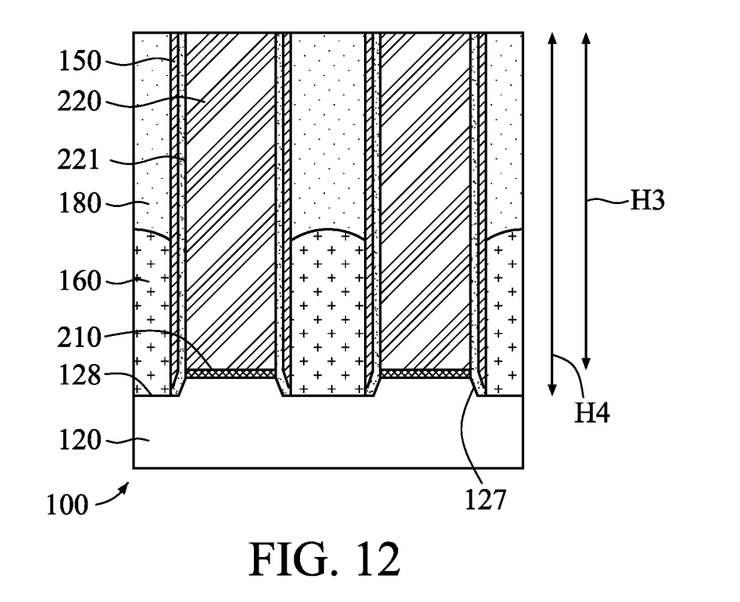

Referring to FIGS. 11 and 12, the device 100 is illustrated at the stage of fabrication after performing operations S420, S425, S430, and S435.

As shown in FIG. 11, each spacer 150 is located on each sidewall 221 of dummy structures 220. Further, spacer 150 extends below a bottom edge of each dummy structure 220 to contact the top surface 113 (labeled in FIG. 9) of the semiconductor structure 110. As shown, each spacer 150 contacts the side edge 215 (labeled in FIG. 9) of the layer 210.

Inner spacers 170 are located adjacent to recessed layers of the nanostructure 112. Further, source/drain regions 160 are grown on recessed surfaces 115 of the semiconductor structure 110 on opposite sides of the dummy structures 220 and the non-recessed regions 116 of the semiconductor structure 110.

Further a contact stop etch layer and/or interlayer dielectric material 180 surrounds the dummy structures 220 and lies over the source/drain regions 160. As shown, the planarization process forms a planar top surface and exposes the dummy structure 220.

In FIG. 11, the dummy structure 220 has a height H1 in the direction of the Z-axis and the spacer has a height H2 in the direction of the Z-axis greater than the height HE For example, H2 may equal the sum of the height H1 and the thickness of the layer 210.

As shown in FIG. 12, each spacer 150 is located on each sidewall 221 of dummy structures 220. Further, spacer 150 extends below a bottom edge of each dummy structure 220 to contact the isolation sidewall 127 and cavity bottom surface 128. Each spacer 150 contacts the side edge 216 (labeled in FIG. 10) of the layer 210.

As shown, source/drain regions 160 may grow into contact with cavity bottom surfaces 128 and spacers 150.

Further, the contact stop etch layer and/or interlayer dielectric material 180 surrounds the dummy structures 220 and lies over the source/drain regions 160. As shown, the planarization process forms a planar top surface and exposes the dummy structures 220.

In FIG. 11, the dummy structure 220 has a height H3 in the direction of the Z-axis and the spacer has a height H4 in the direction of the Z-axis greater than the height H3. For example, H4 may equal the sum of the height H3, the thickness of the layer 210, and the depth D1 of the cavity 125 (shown in FIG. 10).

Method 400 may continue with operation S440, which includes removing the dummy structures to form cavities.

Figure 13:
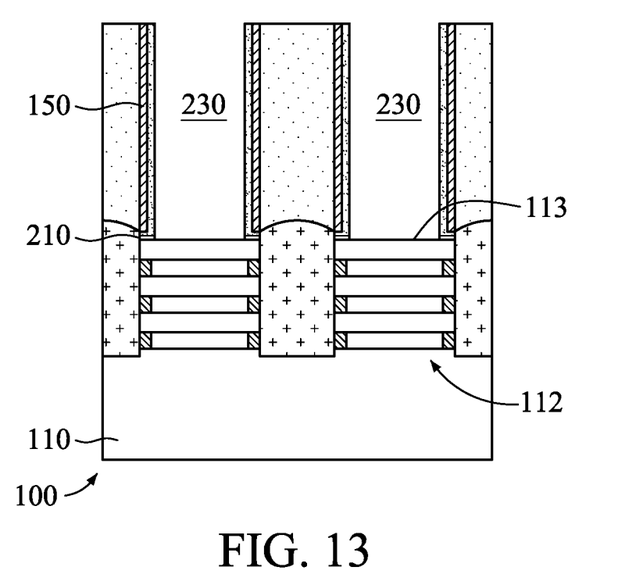
FIGS. 13-14 illustrate a stage of fabrication of the device of FIG. 1 in accordance with some embodiments of the present disclosure, with FIG. 13 being a cross sectional view through the semiconductor structure of the device, and FIG. 14 being a cross sectional view through an isolation of the device.
Figure 14:
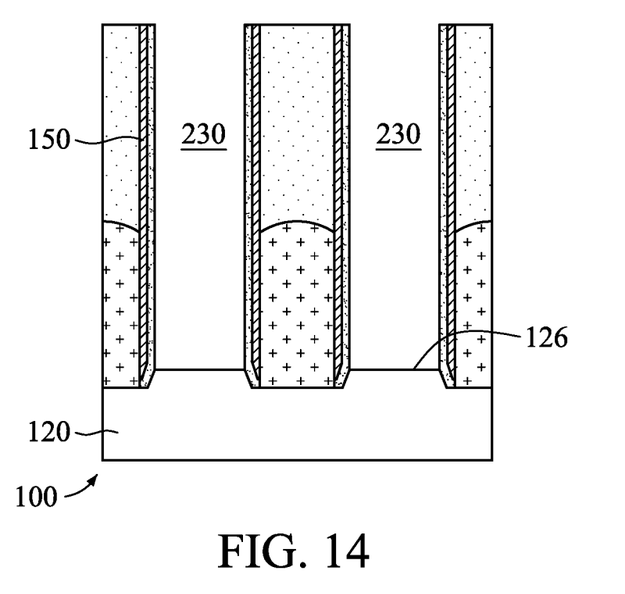
Figure 15:
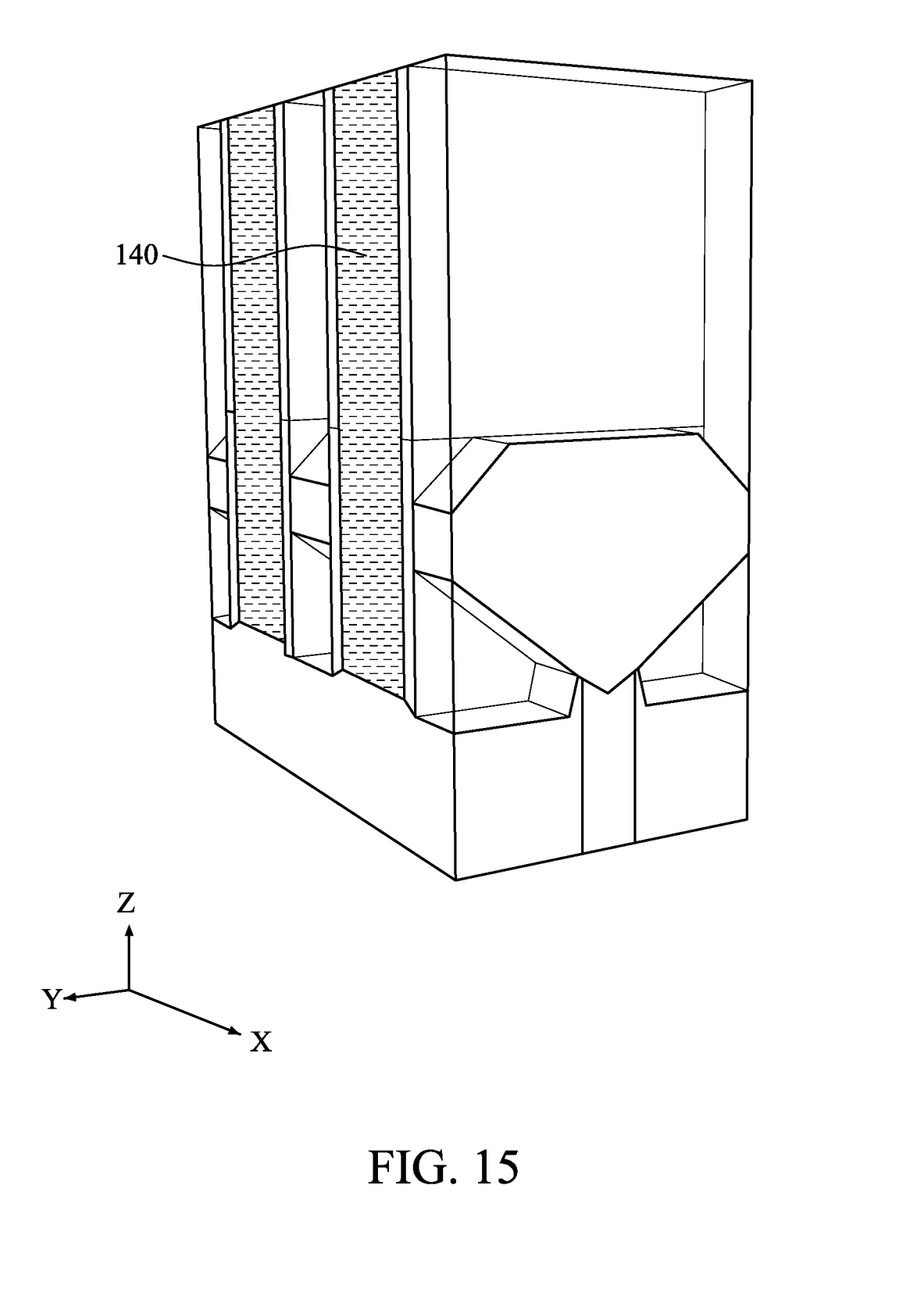
FIGS. 15-17 illustrate a stage of fabrication of the device of FIG. 1 in accordance with some embodiments of the present disclosure, with FIG. 15 being a perspective schematic of the device, FIG. 16 being a cross sectional view through the semiconductor structure of the device, and FIG. 17 being a cross sectional view through an isolation of the device.

FIGS. 13 and 14 illustrate the removal of the dummy structures to form cavities 230.

As shown in FIG. 13, during removal of the dummy structures, the layer 210 lying directly under the dummy structures is removed from the top surface 113. Due to the thickness of the spacer 150, the portion of the layer 210 lying directly under spacer 150 is not breached. The bottom of cavity 230 is formed by top surface 113. Further, as shown in FIG. 13, alternating layers of the nanostructure portion may be removed.

As shown in FIG. 14, layer 210 may be completely removed from over the isolation 120. The bottom of cavity 230 is formed by surface 126 of isolation 120.

Method 400 may continue with operation S445, which includes forming structures in the cavities 230. For example, an overlying structure or replacement structure may be formed, such as a high k metal gate structure.

Figure 16:
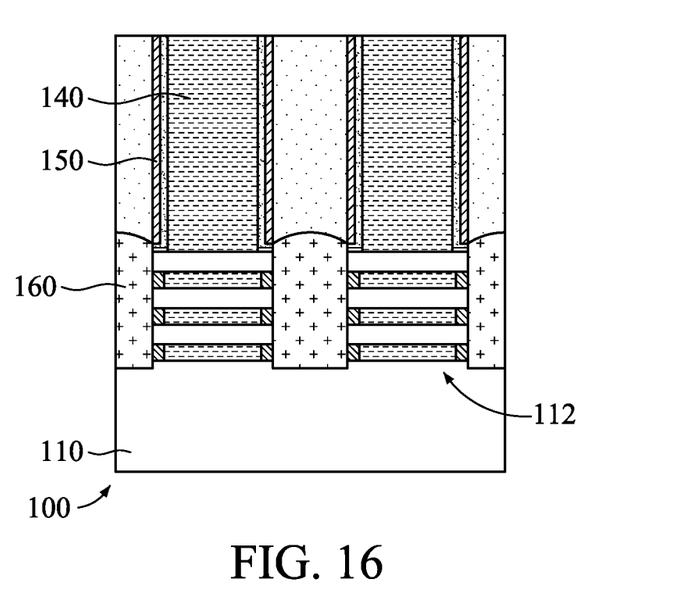
Figure 17:
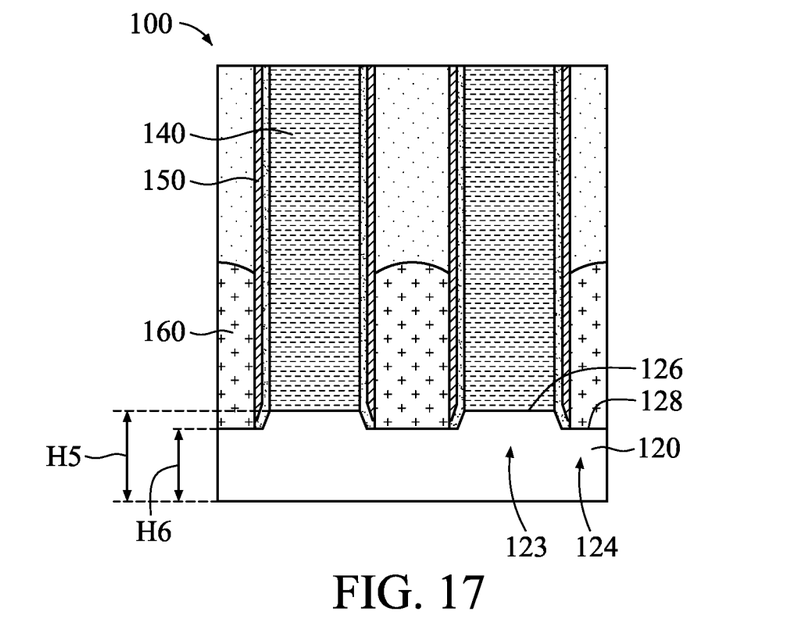

As shown in FIGS. 15-17, overlying structures 140 are formed in the cavities. As shown in FIG. 16, the material forming the overlying structures 140 may fill in around the remaining nanosheet channel of the nanostructure 112.

In FIG. 17, isolation 120 includes a region 123 having an upper surface 126 at a height H5 over the substrate. Further, isolation 120 includes region 124 having an upper surface 128 at a height H6 over the substrate. As shown, height H5 is greater than height H6.

In FIGS. 15-17, the spacer 150 separates and insulates the overlying structure 140 from the epitaxial source/drain regions 160 and separates the top surface 126 of the isolation 120 from the epitaxial source/drain region 160.

As a result of the processing described herein, shorting at the replacement structures is reduced or prevented. Specifically, sufficient dielectric insulation is provided around the dummy structure, around the cavity formed after removing the dummy structure, and after formation of the replacement structure in the cavity.

In an exemplary embodiment, a dielectric etch stop layer is formed under a spacer and the dielectric etch stop and spacer are provided with a sufficient thickness to withstand removal of the sacrificial structure and formation of the replacement structure without being breached.

A method is provided in accordance with some embodiments. The method includes forming an etch stop layer over a semiconductor material having a top surface in a horizontal plane; forming a dummy structure over the etch stop layer, wherein the dummy structure has a dummy sidewall, wherein the dummy structure lies directly over a first region of the etch stop layer and over a first region of the semiconductor material under the first region of the etch stop layer, and wherein the dummy structure does not lie directly over a second region of the etch stop layer or over a second region of the semiconductor material under the second region of the etch stop layer, and removing the second region of the etch stop layer and forming a side edge of the first region of the etch stop layer, wherein the side edge forms an angle of from 90 to 100 degrees with the horizontal plane.

In certain embodiments of the method, removing the second region of the etch stop layer and forming the side edge of the first region of the etch stop layer includes performing a plasma etch process.

In certain embodiments of the method, forming a structure spacer layer over the dummy sidewall, over the side edge of the first region of the etch stop layer; and over the second region of the semiconductor material, wherein an upward-extending portion of the structure spacer layer extends from the semiconductor material to a top of the dummy structure, wherein an inner sub-region of the second region of the semiconductor material lies directly under the upward-extending portion of the structure spacer layer, and wherein an outer sub-region of the second region of the semiconductor material does not lie directly under the upward-extending portion of the structure spacer layer; and etching the structure spacer layer from the outer sub-region of the second region of the semiconductor material, wherein a remaining portion of the structure spacer layer forms a structure spacer on the dummy sidewall and on the side edge of the first region of the etch stop layer.

In certain embodiments, the method further includes recessing the outer sub-region of the second region of the semiconductor material to a recessed surface; and forming a source/drain region on the recessed surface, wherein the structure spacer separates the source/drain region from the dummy structure. In such embodiments, the method may further include removing the dummy structure and the etch stop layer to form a structure cavity; and forming a replacement structure in the structure cavity, wherein the structure spacer separates the source/drain region from the replacement structure, and wherein the structure spacer has a thickness of at least 3 nanometers (nm).

In certain embodiments, the method further includes forming a nanostructure over a fin, wherein an uppermost layer of the nanostructure forms the semiconductor material over which the etch stop layer is formed.

In certain embodiments of the method, forming the etch stop layer over the semiconductor material includes forming the etch stop layer over the semiconductor material and over an isolation adjacent to the semiconductor material; forming the dummy structure over the etch stop layer includes forming the dummy structure directly over the first region of the etch stop layer and over a first region of the isolation under the first region of the etch stop layer, wherein the dummy structure does not lie directly over a second region of the isolation under the second region of the etch stop layer; and removing the second region of the etch stop layer includes removing an upper level of the second region of the isolation to form an isolation cavity in the second region of the isolation, wherein an isolation sidewall extends from the isolation cavity to the first region of the isolation. In such embodiments, the upper level of the second region of the isolation and the isolation cavity may have a height of from 3 to 20 nanometers (nm).

A method is provided in accordance with some embodiments. The method includes forming an insulation layer over a fin structure and an isolation adjacent to the fin structure; forming a dummy gate over the insulation layer, wherein the dummy gate has a dummy sidewall, wherein the dummy gate lies directly over a first region of the insulation layer and over a first region of the isolation under the first region of the insulation layer, and wherein the dummy gate does not lie directly over a second region of the insulation layer or over a second region of the isolation under the second region of the insulation layer, removing the second region of the insulation layer and an upper level of the second region of the isolation to form a cavity in the second region of the isolation, wherein an isolation sidewall extends from the cavity to the first region of the isolation; and forming a gate spacer layer over the dummy sidewall and over the isolation sidewall.

In certain embodiments of the method, the upper level of the second region of the isolation and the cavity in the second region of the isolation have a height of from 3 to 20 nanometers (nm).

In certain embodiments of the method, removing the second region of the insulation layer forms a side edge of the first region of the insulation layer, and the entire side edge is parallel with the dummy sidewall or lies under the dummy gate.

In certain embodiments, the method further includes planarizing the dummy gate and the gate spacer layer, wherein, after planarizing, the dummy gate has a first height and the gate spacer layer has a second height greater than the first height.

In certain embodiments, the method further includes forming an epitaxial source/drain region over the cavity in the second region of the isolation, and the gate spacer layer separates the epitaxial source/drain region from the isolation sidewall.

In certain embodiments, the method further includes forming an epitaxial source/drain region over the cavity in the second region of the isolation; removing the dummy gate to form a gate cavity adjacent to the gate spacer layer, a bottom surface of the gate cavity is formed by a top surface of the isolation; and forming a conductive gate in the gate cavity, and the gate spacer layer separates the conductive gate from the epitaxial source/drain region and separates the top surface of the isolation from the epitaxial source/drain region.

In certain embodiments of the method, the dummy gate lies directly over the first region of the insulation layer, over the first region of the isolation under the first region of the insulation layer and over a first region of the fin structure under the first region of the insulation layer; the dummy gate does not lie directly over the second region of the insulation layer, over the second region of the isolation under the second region of the insulation layer, or over a second region of the fin structure under the second region of the insulation layer; and removing the second region of the insulation layer and the upper level of the second region of the isolation to form the cavity in the second region of the isolation includes forming a side edge of the first region of the insulation layer over the fin structure, and the side edge forms an angle of from 90 to 100 degrees with a horizontal plane perpendicular to the fin structure.

A device is provided in accordance with some embodiments. The device includes a semiconductor structure and an isolation adjacent to the semiconductor structure formed over a substrate, the isolation includes a first region having an upper surface at a first height over the substrate, the isolation includes a second region having an upper surface at a second height over the substrate, the first height is equal to the second height plus 3 to 20 nanometers (nm); a conductive gate located over the semiconductor structure and over the first region of the isolation at the first height; and a source/drain region located over the second region of the isolation at the second height.

In certain embodiments of the device, an isolation sidewall extends from the first region to the second region, and the semiconductor structure further includes a gate spacer on the isolation sidewall.

In certain embodiments of the device, the conductive gate has a gate sidewall, and the gate spacer is located on the gate sidewall.

In certain embodiments of the device, the conductive gate has a gate sidewall located over the semiconductor structure, the semiconductor structure further includes a gate spacer is located on the gate sidewall over the semiconductor structure, and the gate spacer has a minimum thickness of 3 nanometers (nm).

In certain embodiments of the device, the semiconductor structure includes a nanostructure over a fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming an etch stop layer over a semiconductor material having a top surface in a horizontal plane;
   forming a dummy structure over the etch stop layer, wherein the dummy structure has a dummy sidewall, wherein the dummy structure lies directly over a first region of the etch stop layer and over a first region of the semiconductor material under the first region of the etch stop layer, and wherein the dummy structure does not lie directly over a second region of the etch stop layer or over a second region of the semiconductor material under the second region of the etch stop layer, and
   removing the second region of the etch stop layer and forming a side edge of the first region of the etch stop layer, wherein the side edge forms an angle of from 90 to 100 degrees with the horizontal plane.

2. The method of claim 1, wherein removing the second region of the etch stop layer and forming the side edge of the first region of the etch stop layer comprises performing a plasma etch process.

3. The method of claim 1, further comprising:
   forming a structure spacer layer over the dummy sidewall, over the side edge of the first region of the etch stop layer; and over the second region of the semiconductor material,
   wherein an upward-extending portion of the structure spacer layer extends from the semiconductor material to a top of the dummy structure, wherein an inner sub-region of the second region of the semiconductor material lies directly under the upward-extending portion of the structure spacer layer, and wherein an outer sub-region of the second region of the semiconductor material does not lie directly under the upward-extending portion of the structure spacer layer; and
   etching the structure spacer layer from the outer sub-region of the second region of the semiconductor material, wherein a remaining portion of the structure spacer layer forms a structure spacer on the dummy sidewall and on the side edge of the first region of the etch stop layer.

4. The method of claim 3, further comprising:
   recessing the outer sub-region of the second region of the semiconductor material to a recessed surface; and
   forming a source/drain region on the recessed surface, wherein the structure spacer separates the source/drain region from the dummy structure.

5. The method of claim 4, further comprising:
   removing the dummy structure and the etch stop layer to form a structure cavity; and
   forming a replacement structure in the structure cavity, wherein the structure spacer separates the source/drain region from the replacement structure, and wherein the structure spacer has a thickness of at least 3 nanometers (nm).

6. The method of claim 1, further comprising forming a nanostructure over a fin, wherein an uppermost layer of the nanostructure forms the semiconductor material over which the etch stop layer is formed.

7. The method of claim 1, wherein:
   forming the etch stop layer over the semiconductor material comprises forming the etch stop layer over the semiconductor material and over an isolation adjacent to the semiconductor material;
   forming the dummy structure over the etch stop layer comprises forming the dummy structure directly over the first region of the etch stop layer and over a first region of the isolation under the first region of the etch stop layer, wherein the dummy structure does not lie directly over a second region of the isolation under the second region of the etch stop layer; and
   removing the second region of the etch stop layer comprises removing an upper level of the second region of the isolation to form an isolation cavity in the second region of the isolation, wherein an isolation sidewall extends from the isolation cavity to the first region of the isolation.

8. The method of claim 7, wherein the upper level of the second region of the isolation and the isolation cavity have a height of from 3 to 20 nanometers (nm).

9. A method, comprising:
   forming an insulation layer over a fin structure and an isolation adjacent to the fin structure;
   forming a dummy gate over the insulation layer, wherein the dummy gate has a dummy sidewall, wherein the dummy gate lies directly over a first region of the insulation layer and over a first region of the isolation under the first region of the insulation layer, and wherein the dummy gate does not lie directly over a second region of the insulation layer or over a second region of the isolation under the second region of the insulation layer,
   removing the second region of the insulation layer and an upper level of the second region of the isolation to form a cavity in the second region of the isolation, wherein an isolation sidewall extends from the cavity to the first region of the isolation; and
   forming a gate spacer layer over the dummy sidewall and over the isolation sidewall.

10. The method of claim 9, wherein the upper level of the second region of the isolation and the cavity in the second region of the isolation have a height of from 3 to 20 nanometers (nm).

11. The method of claim 9, wherein removing the second region of the insulation layer forms a side edge of the first region of the insulation layer, wherein the entire side edge is parallel with the dummy sidewall or lies under the dummy gate.

12. The method of claim 9 further comprising planarizing the dummy gate and the gate spacer layer, wherein, after planarizing, the dummy gate has a first height and the gate spacer layer has a second height greater than the first height.

13. The method of claim 9, further comprising forming an epitaxial source/drain region over the cavity in the second region of the isolation, wherein the gate spacer layer separates the epitaxial source/drain region from the isolation sidewall.

14. The method of claim 9, further comprising:
forming an epitaxial source/drain region over the cavity in the second region of the isolation;
removing the dummy gate to form a gate cavity adjacent to the gate spacer layer, wherein a bottom surface of the gate cavity is formed by a top surface of the isolation; and
forming a conductive gate in the gate cavity, wherein the gate spacer layer separates the conductive gate from the epitaxial source/drain region and separates the top surface of the isolation from the epitaxial source/drain region.

15. The method of claim 9, wherein:
the dummy gate lies directly over the first region of the insulation layer, over the first region of the isolation under the first region of the insulation layer and over a first region of the fin structure under the first region of the insulation layer;
the dummy gate does not lie directly over the second region of the insulation layer, over the second region of the isolation under the second region of the insulation layer, or over a second region of the fin structure under the second region of the insulation layer; and
removing the second region of the insulation layer and the upper level of the second region of the isolation to form the cavity in the second region of the isolation comprises forming a side edge of the first region of the insulation layer over the fin structure, wherein the side edge forms an angle of from 90 to 100 degrees with a horizontal plane perpendicular to the fin structure.

16. The method of claim 9, wherein forming the gate spacer layer over the dummy sidewall and over the isolation sidewall comprises forming the gate spacer layer directly on the dummy sidewall and over the isolation sidewall.

17. The method of claim 9, wherein removing the second region of the insulation layer and the upper level of the second region of the isolation to form the cavity in the second region of the isolation comprises forming a side edge of the first region of the insulation layer over the fin structure, wherein the side edge forms an angle of from 90 to 100 degrees with a horizontal plane perpendicular to the fin structure.

18. The method of claim 9, further comprising:
forming an epitaxial source/drain region over the cavity in the second region of the isolation;
removing the dummy gate to form a gate cavity adjacent to the gate spacer layer, wherein a bottom surface of the gate cavity is formed by a top surface of the isolation; and
forming a conductive gate in the gate cavity, wherein the gate spacer layer separates the conductive gate from the epitaxial source/drain region and separates the top surface of the isolation from the epitaxial source/drain region, and wherein a bottom surface of the epitaxial source/drain region is located at a height below the top surface of the isolation.

19. The method of claim 18, wherein the height is from 3 to 20 nanometers (nm).

20. The method of claim 9, wherein:
removing the second region of the insulation layer forms a side edge of the first region of the insulation layer;
the entire side edge is parallel with the dummy sidewall or lies under the dummy gate;
the method further comprises forming an epitaxial source/drain region over the cavity in the second region of the isolation;
the gate spacer layer separates the epitaxial source/drain region from the isolation sidewall;
the method further comprises planarizing the dummy gate and the gate spacer layer;
after planarizing, the dummy gate has a first height and the gate spacer layer has a second height greater than the first height;
the method further comprises removing the dummy gate to form a gate cavity adjacent to the gate spacer layer;
a bottom surface of the gate cavity is formed by a top surface of the isolation;
the method further comprises forming a conductive gate in the gate cavity; and
the gate spacer layer separates the conductive gate from the epitaxial source/drain region and separates the top surface of the isolation from the epitaxial source/drain region.

* * * * *